United States Patent [19]

Kobayashi

[11] Patent Number: 5,017,982

[45] Date of Patent: May 21, 1991

[54] CAPACITOR IN SEMICONDUCTOR DEVICE

[75] Inventor: Kiyoteru Kobayashi, Hyogo, Japan

[73] Assignee: Mitsubishi Denki Kabushiki Kaisha, Tokyo, Japan

[21] Appl. No.: 432,430

[22] Filed: Nov. 6, 1989

[30] Foreign Application Priority Data

Nov. 15, 1988 [JP] Japan .................. 63-289263

[51] Int. Cl.⁵ ............................................. H01L 29/68
[52] U.S. Cl. ..................... 357/23.6; 357/51; 357/54
[58] Field of Search ............................ 357/23.6, 51, 54

[56] References Cited

U.S. PATENT DOCUMENTS 4,922,312  5/1990  Coleman et al. ............... 357/23.6
4,931,897  6/1990  Tsukamoto et al. ............ 357/51

FOREIGN PATENT DOCUMENTS 56-66065  6/1981  Japan .
60-770    1/1985  Japan .
64-42161  2/1989  Japan ............................. 357/51

OTHER PUBLICATIONS

"Breakdown Characteristics of 30P-c-4 SiO₂/Si₃N₄ Double Layer Film", (A Paper of the Japanese Society of Applied Physics, Mar. 28, 1987, p. 557.
"TDDB Characteristics in 19P-N-3 MONOS Structure" (A Paper of the Japanese Society of Applied Physics, Oct. 17, 1987, p. 570.
"Inter-Poly SiO₂/Si₃N₄ Capacitor Films 5 nm Thick for Deep Submicron LSIs" (Extended Abstracts of the 20th Conf. on Solid State Devices & Materials, 173-176.
"Reliability of Nano-Meter Thick Multi-Layer Dielectric Films on Polycrystalline Silicon" (25th Annual Proceedings of Reliability Physics, 1987, pp. 55-59.

Primary Examiner—Andrew J. James
Assistant Examiner—Courtney A. Bowers
Attorney, Agent, or Firm—Lowe, Price, LeBlanc, Becker & Shur

[57] ABSTRACT

A capacitor including two electrode layers and a dielectric interposed between the electrode layers. The dielectric layer includes a silicon nitride film and a silicon oxide film formed on the surface of the silicon nitride film. The thickness of the silicon oxide film is not smaller than 25 Å and not larger than 35 Å. In this thickness range there is attained the maximum capacitor life. The capacitor is used in a semiconductor memory, improving the device reliability.

4 Claims, 6 Drawing Sheets

CAPACITOR IN SEMICONDUCTOR DEVICE

BACKGROUND OF THE INVENTION

1. Field of the invention

The present invention relates to a semiconductor device, particularly a capacitor formed in a semiconductor device. For example, the present invention is concerned with an improvement of a memory capacitor in a dynamic random access memory (hereinafter referred to as "DRAM") having a memory cell comprising one transistor and one capacitor.

2. Description of the Background Art

As one of passive elements constituting a semiconductor integrated circuit there is a capacitor, which is a basic and important element in circuit configuration. Generally, a capacitor is constituted by sandwiching a dielectric film sideways in between two electrode layers, and is electrically charged by applying a voltage across those electrode layers. The amount of an electric charge capable of being stored in the capacitor, namely, capacitance, is proportional to the opposed area between the electrodes and inversely proportional to the thickness of the dielectric film. The present technical advancement, in one direction thereof, aims at increasing capacitance by thinning the dielectric film and using a material of a large dielectric constant.

A DRAM (Dynamic Random Access Memory) is one example of a semiconductor integrated circuit using a capacitor. The structure of a memory cell in a DRAM having a capacitor is shown in Japanese Patent Laying-Open No. 66065/1981 (hereinafter referred to as the prior art literature 1). FIG. 10 illustrates a sectional structure of the memory cell of the DRAM shown in the prior art literature 1. The memory cell includes one MOS (Metal Oxide Semiconductor) type field effect transistor and one capacitor. MOS type field effect transistor is provided with an $n^+$ impurity region 7 formed in a semiconductor substrate 1 and a gate electrode 6 formed on the surface of the semiconductor substrate 1 through a gate insulating film 5. The gate electrode 6 is formed of polycrystalline silicon. The capacitor has an n-type impurity region 4a formed in the semiconductor substrate 1, a dielectric layer 3 formed on the surface of the n-type impurity region and an upper electrode 4b formed on the surface of the dielectric layer 3. The upper electrode 4b is formed of polycrystalline silicon. The dielectric layer 3 is of a three-layer structure wherein a silicon nitride film 8 is sandwiched in between silicon oxide films 9 and 20. Adjacent memory cells are isolated from each other by a field insulating layer 2.

The memory cell in the DRAM performs a storing operation by making information corresponding to the presence or absence of an electric charge stored in the capacitor. Therefore, the capacitor is required to hold capacitance in an amount not smaller than a predetermined amount.

On the other hand, the following are mentioned as prior art literatures giving consideration to the characteristics of the capacitor dielectric layer under the aforementioned background;

(1) Japanese Patent Publication No. 770/1985 (the prior art literature 2, hereinafter).

(2) "Breakdown Characteristics of 30P-c-4 $SiO_2$/$Si_3N_4$ Double-layer Film" (A paper of the Japanese Society of Applied Physics, Mar. 28, 1987, P. 557) the prior art literature 3, hereinafter).

(3) "TDDB Characteristics in 19P-N-3 MONOS Structure" (A paper of the Japanese Society of Applied Physics, Oct. 17, 1987, P. 570) (the prior art literature 4, hereinafter).

(4) "Inter-Poly $SiO_2$/$Si_3N_4$ Capacitor Films 5 nm Thick for Deep Submicron LSIs" (Extended Abstracts of the 20th (1988 International) Conference on Solid State Devices and Materials, Tokyo, 1988, pp. 173-176) the prior art literature 5, hereinafter).

(5) "Reliability of nano-meter thick multi-layer dielectric films on polycrystalline silicon" (25th annual proceedings of reliability physics, 1987) (the prior art literature 6, hereinafter).

In the prior art literature 2, it is described that storage capacitance is formed on the sidewalls of a groove formed in a silicon substrate and that an insulating film of the storage capacitance is formed as a three-layer insulating film comprising silicon dioxide, silicon nitride and silicon dioxide layers, the total film thickness being 20 nm (200Å). However, the thickness of each constituent layer of the three-layer structure is not shown therein.

In the prior art literature 3, it is described that in an MIS capacitor using an $SiO_2$/$Si_3N_4$ film as an insulating film, the life of a double-layer film having a thin oxide film is long. Oxide films 20Å and 40Å in thickness, respectively, are shown therein.

In the prior art literature 4, it is disclosed that intrinsic time of breakdown becomes longer as the upper oxide film becomes thinner in an NONOS capacitor employing an ONO(Oxide-Nitride-Oxide) film as an insulating film. The thickness of the lower oxide film is 40Å and the thickness of the nitride film is 90Å. However, the thickness of the upper oxide film is not shown.

In the prior art literature 5, the life of a capacitor employing silicon dioxide and silicon nitride are used as an insulating films is made longer when the oxide film has the thickness of 2 nm (20Å) than when the oxide film is 0 nm.

In the prior art literature 6, it is said that the thickness of the upper oxide film must be as thin as possible so long as it prevents leak current, in a capacitor employing silicon dioxide and silicon nitride. Oxide films having the thickness of 20Å and 40Å are disclosed as examples.

On the basis of the aforementioned prior art literature the present inventors produced two capacitors each having an insulating layer of a three-layer structure comprising silicon dioxide, silicon nitride and silicon dioxide layers, one capacitor having an upper silicon dioxide layer 20Å in thickness and the other 40Å, and tested Time Dependent Dielectric Breakdown characteristic (hereinafter referred to as "TDDB characteristic"). But both capacitors were inferior in TDDB characteristic and their reliability as capacitors was poor. From this fact it is presumed that in the capacitor having a silicon dioxide film thickness of 40Å, if it is used for a long time under the application of voltage between both electrodes of the capacitor, electrons will be accumulated in the silicon oxide film 10, resulting in deterioration of the film, leading to dielectric breakdown of the insulating layer 3.

In the capacitor having a silicon dioxide film thickness of 20Å, because of such a small silicon dioxide film thickness, it is presumed that the nitride film will involve various defects, thus causing dielectric breakdown.

More particularly, in case of a thin nitride film, various defective portions are apt to occur in the nitride film at the time of deposition. The upper silicon dioxide film acts to remedy such defects of the nitride film. However, if this silicon dioxide film is thin, its defect remedying function will be unsatisfactory, thus allowing the defective portions to remain in the nitride film.

SUMMARY OF THE INVENTION

An object of the present invention is to improve the life of a capacitor.

Another object of the present invention is to provide a capacitor having an optimum thickness of a dielectric layer.

Further object of the present invention is to provide a semiconductor memory having an improved capacitor life.

The capacitor in a semiconductor device according to the present invention has first and second electrode layers and a dielectric layer interposed between those electrode layers. The dielectric layer has a silicon nitride film formed on the first electrode layer and a silicon oxide layer formed in contact with the upper surface of the said silicon nitride film and having a thickness not smaller than 25Å and not larger than 35Å.

Where the silicon oxide film thickness is in the above thickness range, the dielectric layer of the capacitor is improved in its dielectric strength, thus permitting prolongation of the capacitor life.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2, 3, 4, 5, 6, 7 and 8 are sectional views successively showing manufacturing steps for the memory cell in the DRAM illustrated in FIG. 1;

DESCRIPTION OF THE PREFERRED EMBODIMENTS

Figure 1A:
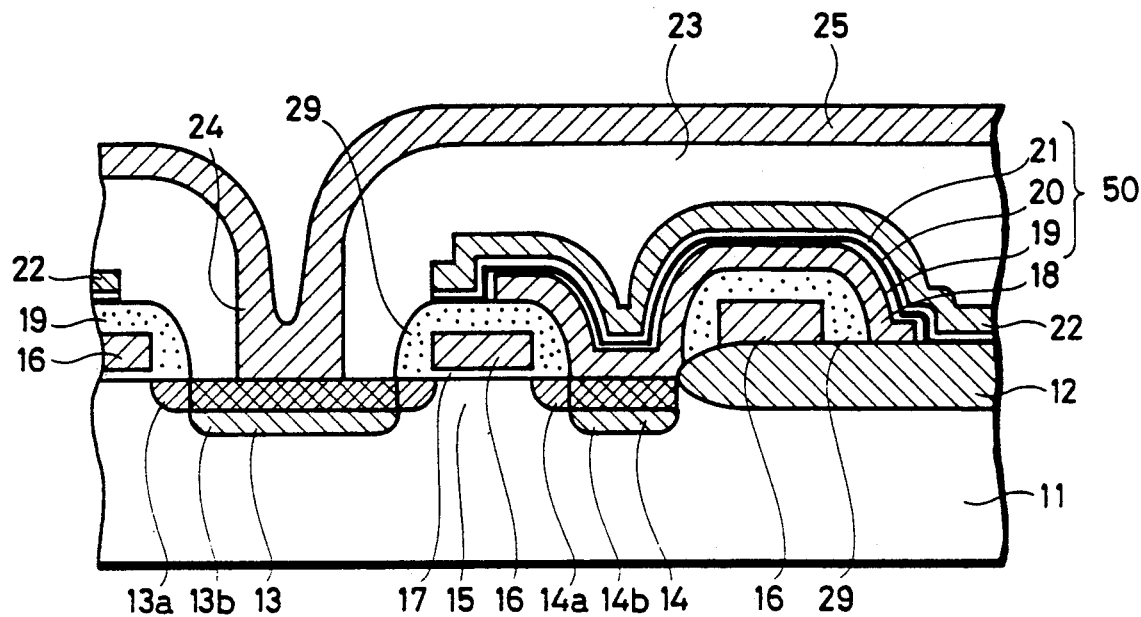
FIGS. 1 and 2 are sectional structural views of a memory cell in a DRAM according to two embodiments of the present invention.

A sectional structure of a memory cell in a DRAM according to an embodiment of the present invention is shown in FIG. 1A. With reference to FIG. 1A, the memory cell is provided with one access transistor and one capacitor, and it is surrounded by a field isolating oxide film 12, which film is a silicon oxide film having a thickness of about 1,000Å.

The access transistor has a pair of source/drain regions 13, 14, a gate insulating film 17 and a gate electrode 16. The source/drain regions 13, 14 are formed on both sides of a channel region 15 in a major surface of a p-type semiconductor substrate 11. The source/drain region 13 is composed of an n-type impurity region 13a of a low concentration and an n-type impurity region 13b of a high concentration formed shallowly and deep, respectively, in the p-type semiconductor substrate 11, and the source/drain region 14 is also composed of like impurity regions 14a and 14b of low and high concentrations formed shallowly and deep, respectively. This source/drain structure is termed LDD (Lightly Doped Drain) structure.

The gate electrode 16 is formed by a polycrystalline silicon on the surface of the channel region 15 through the gate insulating film 17. It constitutes a part of a word line.

The capacitor includes a first electrode layer (storage node) 18, a dielectric layer 50 and a second electrode layer (cell plate) 22. One end of the first electrode layer 18 overlies on the upper portion of the gate electrode 16 through an insulating film 29, while the other end thereof, extends onto the upper surface of the field isolating oxide film 12 through the upper portion of the word line (gate electrode) 16 which passes the upper portion of the field isolating oxide film 12. Further, part of the first electrode layer 18 is connected to the drain region 14 of the access transistor. The dielectric layer 50 has a laminated three-layer structure comprising a lower oxide film 19, a nitride film 20 and an upper oxide film 21 successively from below. The lower oxide film 19 is a silicon oxide ($SiO_2$) film having a thickness of 20Å to 30Å formed by natural oxidation of the surface of the first electrode layer 18 which is formed by a polycrystalline silicon. The nitride film 20 is a silicon nitride ($Si_3N_4$) having a thickness of 100Å to 200Å. The upper oxide film 21 is a silicon oxide ($SiO_2$) film having a thickness of about 30Å.

The second electrode layer 22 is constituted by a polycrystalline silicon, film having a thickness of about 2,000Å–3,000Å disposed in opposed relation to the first electrode layer 18.

The upper surface of the capacitor, etc. is covered with an interlayer insulating film 23 formed by BPSG (Boro-Phospho Silicate Glass). In the interlayer insulating film 23, is formed a contact hole 24. A bit line 25, which is an aluminum line, is connected to the source region 13 of the access transistor through the contact hole 24.

Figure 2:
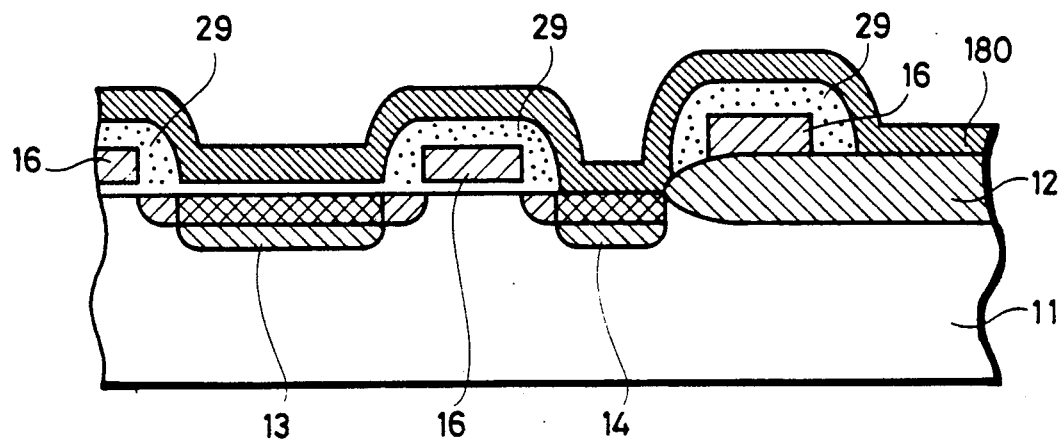

The method for producing the thus-constructed semiconductor device will now be described with reference to FIGS. 2 to 8. The isolating oxide film 16, paired source/drain regions 13, 14, gate electrode 16 (word line) and insulating film 29 are formed in a conventional manner. Thereafter, a polycrystalline silicon film (180) having a thickness of about 2,000Å is formed over the whole surface on the semiconductor substrate by a low pressure CVD (Chemical Vapor Deposition) method, as shown in FIG. 2. Then, a positive type resist is formed on the whole upper surface of the polycrystalline silicon film 180 in a predetermined thickness and a predetermined resist pattern 26 is formed by patterning in a photolithograpy step.

Figure 3:
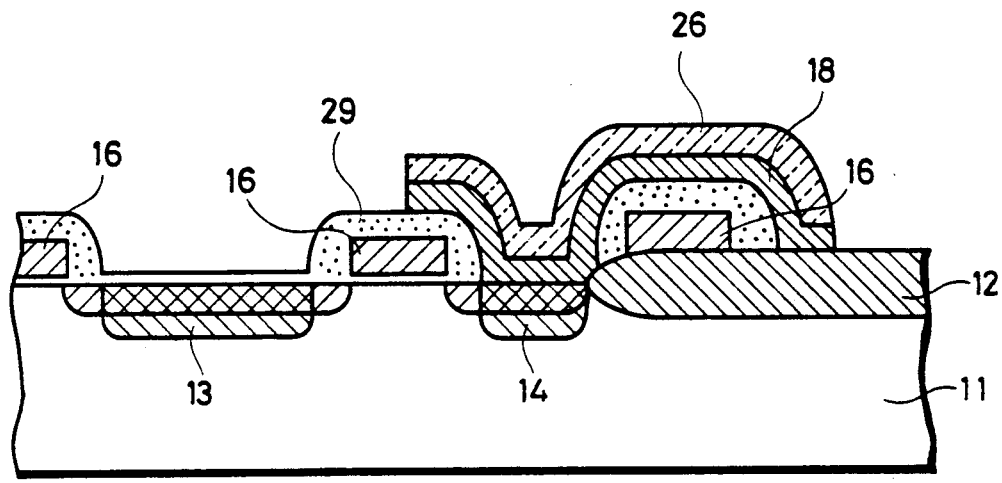

Then, as shown in FIG. 3, with the resist pattern 26 as a mask, the polycrystalline silicon film 180 is removed selectively by reactive ion etching to form a first electrode layer 18.

Figure 4:
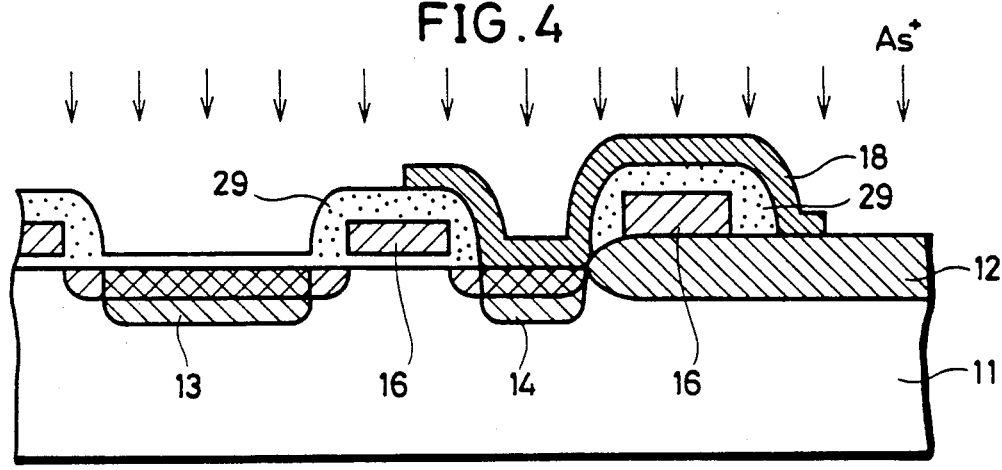

Then, as shown in FIG. 4, after removal of the resist pattern 26, arsenic ion ($As^-$) is implanted in the first electrode layer 18 to enhance the conductivity of the first electrode layer 18.

Figure 5:
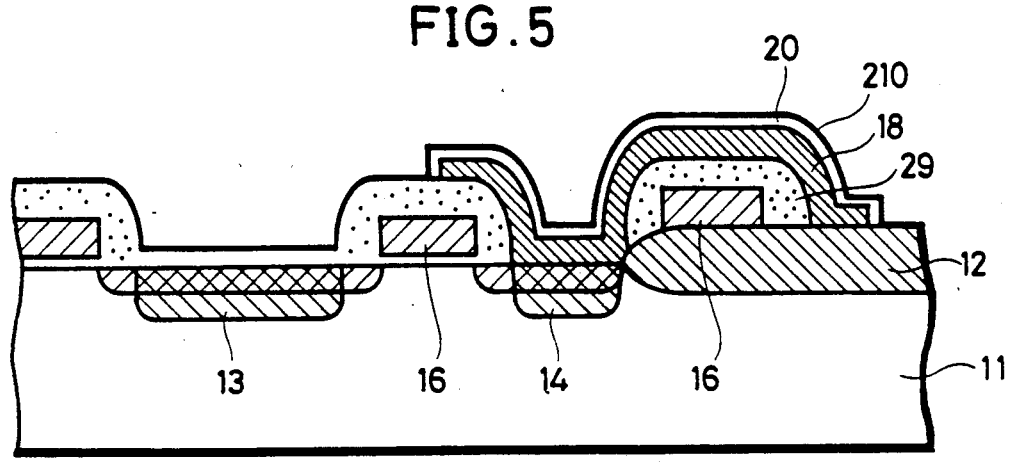

Thereafter, as shown in FIG. 5, a silicon nitride film 20a is formed over the whole surface at a thickness of 100Å to 200Å by a low pressure CVD method. At this time, on the polycrystalline silicon surface serving as the first electrode layer 18, a silicon oxide film of 20Å–30Å is formed as the lower oxide film 19, by natural oxidation with the oxygen in the air.

Figure 6:
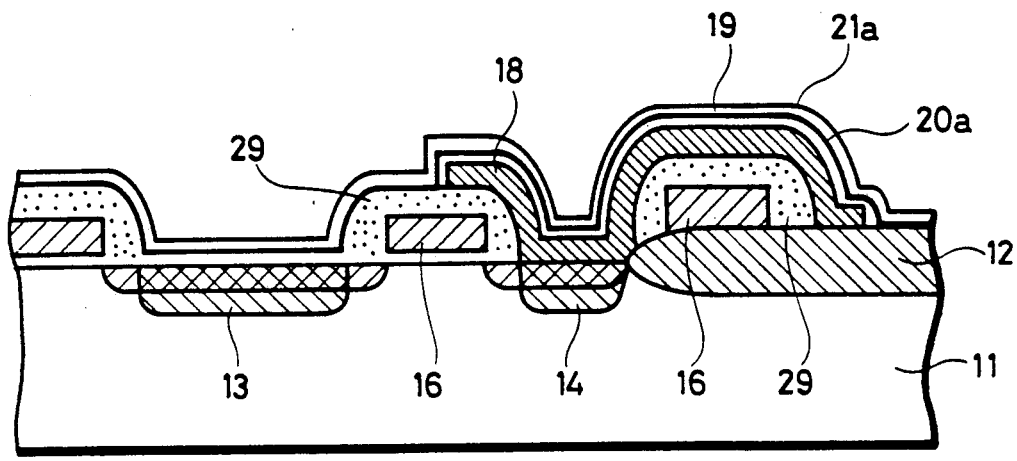
Figure 7:
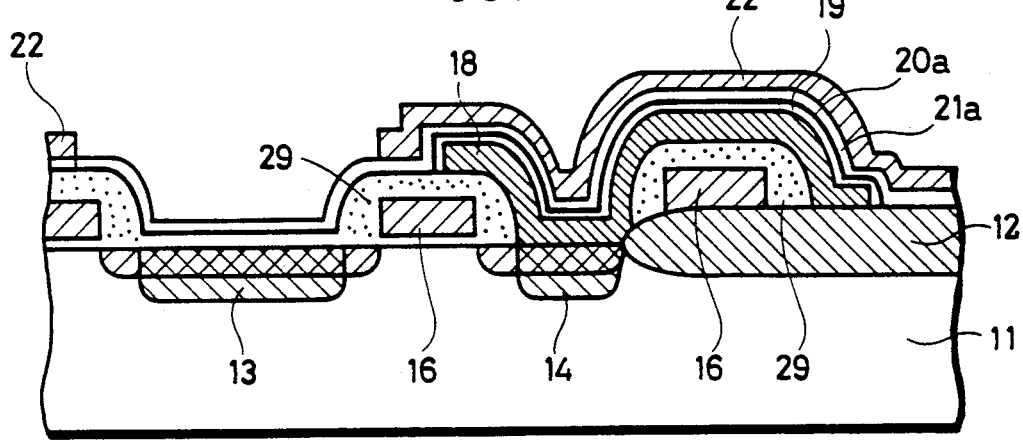

Further, as shown in FIG. 6 the surface of the nitride film 20a is oxidized at a temperature of about 900° C. by a thermal oxidation method to form a silicon oxide layer 21a having a thickness of 30Å, on which is further formed a phosphorus-doped polycrystalline silicon film at a thickness of 2,000Å to 3,000Å by a CVD method. Then, a positive resist is formed on the doped polycrystalline silicon film and a resist pattern is formed by patterning in a photolithography step. With this resist pattern as a mask, the doped polycrystalline silicon is removed selectively to obtain such a second electrode layer 22 as shown in FIG. 7. The second electrode layer 22 is opposed to the first electrode layer 18 and the portion thereof located on the upper portion of one source/drain region is removed.

Thereafter, the arsenic ion and phosphorus doped in the first and second electrode layers 18, 22 are activated by heat treatment in a nitriding atmosphere at 900° C. With the second electrode layer 22 as a mask, the silicon oxide film 21a and the silicon nitride film 20a are removed selectively by etching to form a nitride film 20 and an upper oxide film 21.

Figure 8:
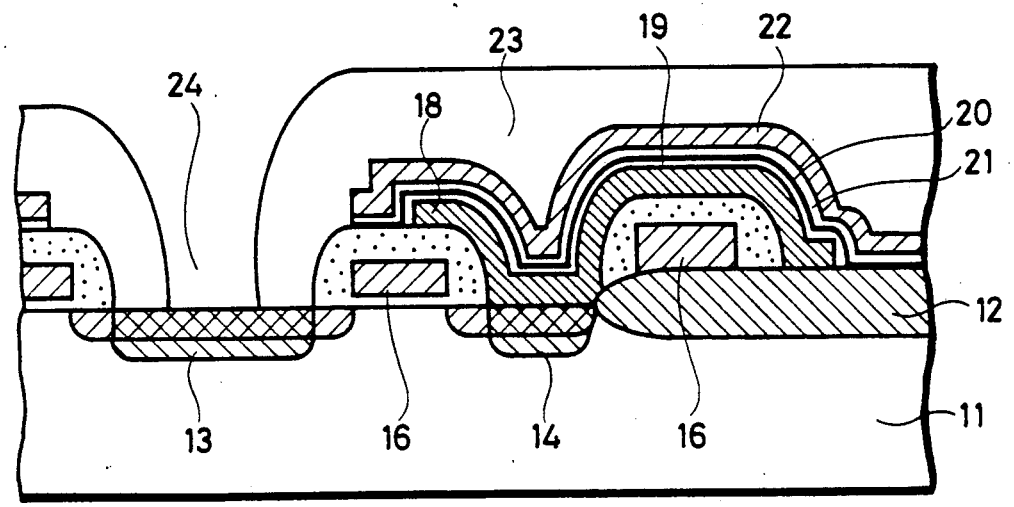

Thereafter, as shown in FIG. 8, a BPSG film is formed on the whole surface, a contact hole 24 is formed in the position of one source/drain region 13, and an interlayer insulating film 23 is formed. On the interlayer insulating film 23 is then formed a bit line 25 which is connected to the one source/drain region, to obtain a memory cell of the structure illustrated in FIG. 1.

Figure 9A:
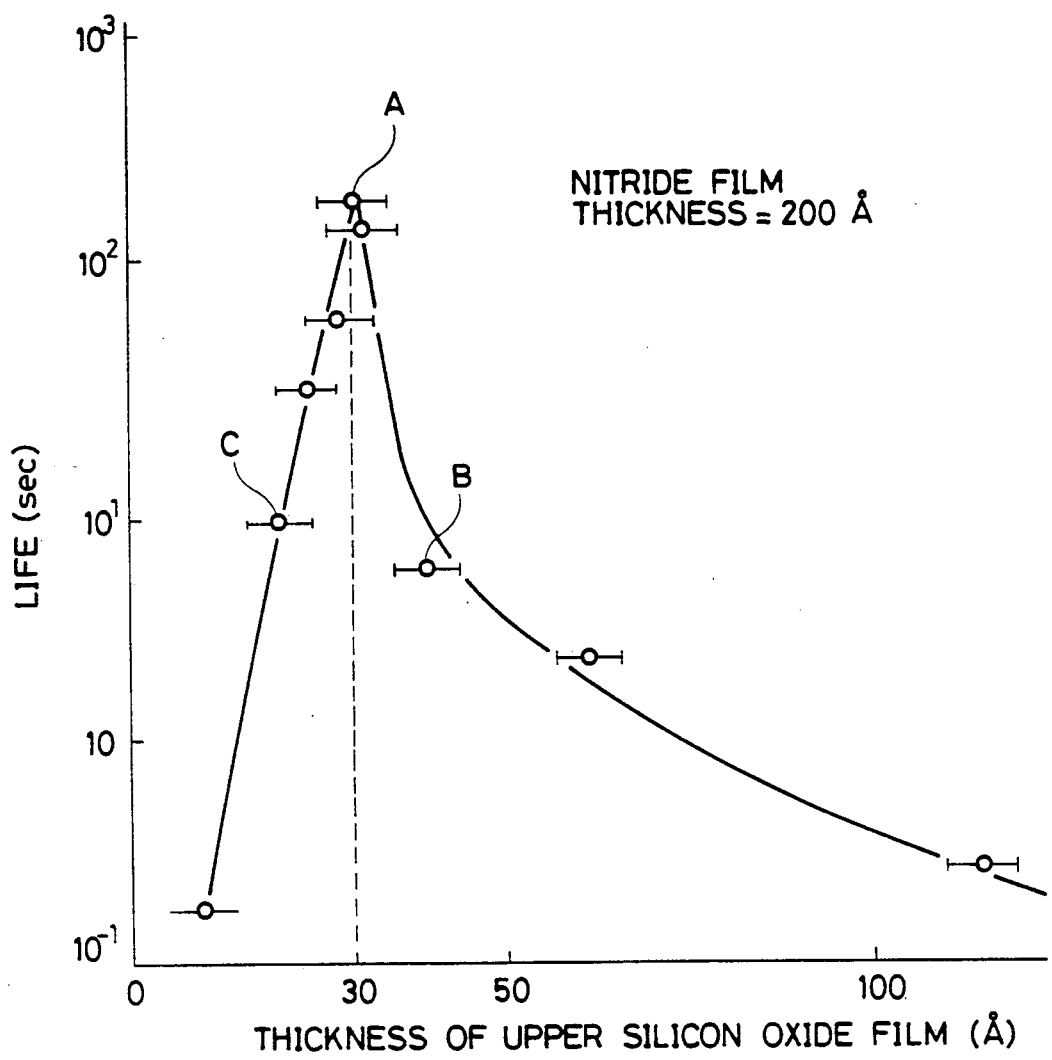
FIGS. 9A, 9B and 9C are correlation diagrams each showing the relation between the thickness of an upper oxide film 21 in an insulating layer of a capacitor and the life of the capacitor.
Figure 10:
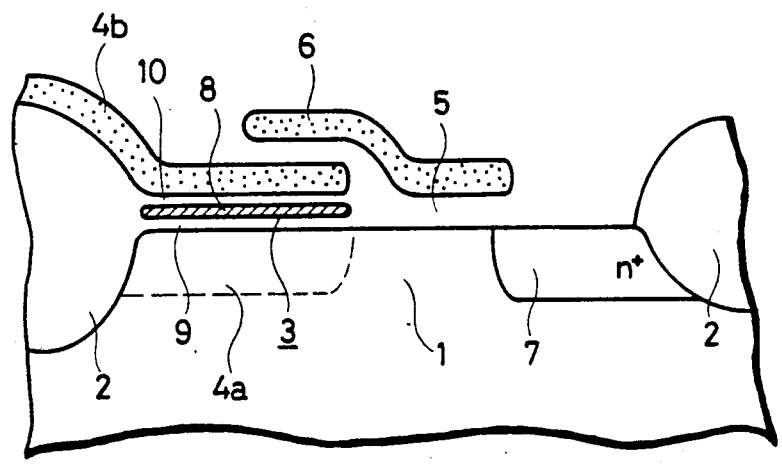
FIG. 10 is a sectional structure view of a conventional memory cell in a DRAM.

A TDDB test was conducted for the semiconductor device constructed as above, under the following conditions. One hundred semiconductor devices were produced for testing purpose. Then, positive bias was applied to the second electrode layer 22 of the capacitor in each semiconductor device; the potential of the first electrode layer 18 was set at the ground potential; an electric field of 13 MV/cm in terms of silicon film was applied to the insulating layer of a three-layer structure; and the time taken until breakdown of the insulating layers in 10% devices out of the one hundred semiconductor devices was measured as the life. The results of this test are as shown in FIG. 9A. In the semiconductor device of this embodiment, attained a longer life than $10^2$ [sec] as indicated at point A in the figure was attained.

In the one hundred semiconductor devices, the thickness of each upper oxide film 21 was determined by section TEM (Transmission Electron Microscopy) method. Variations in thickness were within ±5Å for 30Å.

Next, for comparison with the above embodiment, semiconductor devices having various thickness of upper oxide films 21 were produced each one hundred and TDDB test was conducted in the same manner as above, the results of which are as shown in FIG. 9A. In this figure, the results of the test using the upper oxide films of 20Å and 40Å referred to previously in connection with the prior art are indicated at points C and B. The thickness of the nitride film 20 of each capacitor used in the test shown in FIG. 9A is 200Å.

Figure 9B:
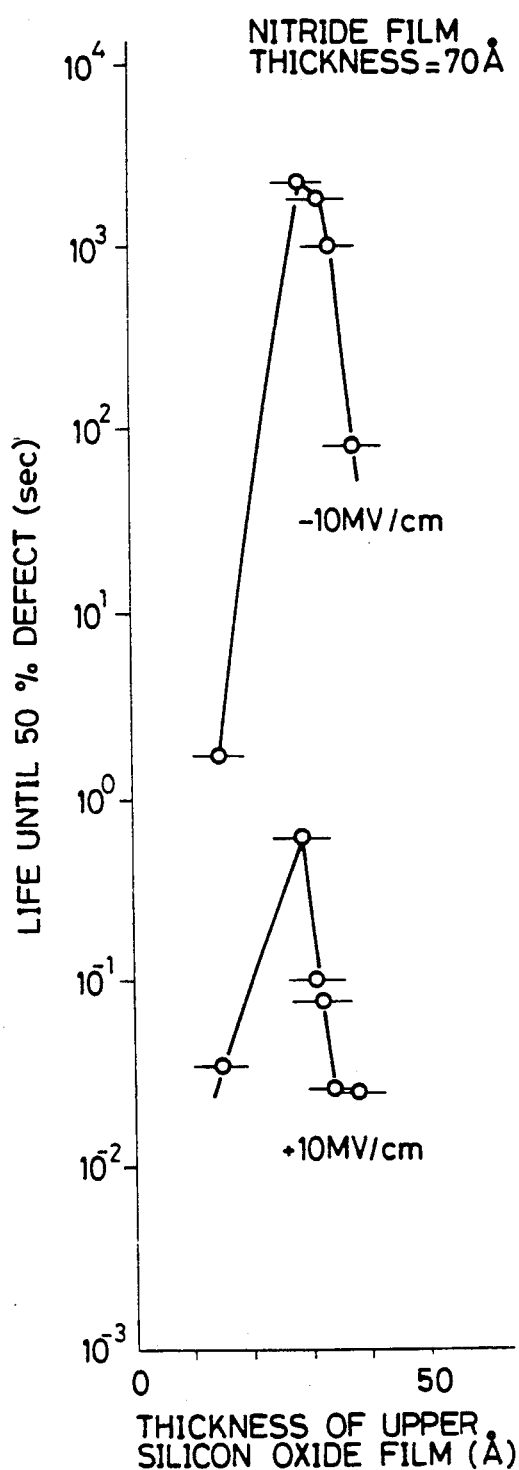
Figure 9C:
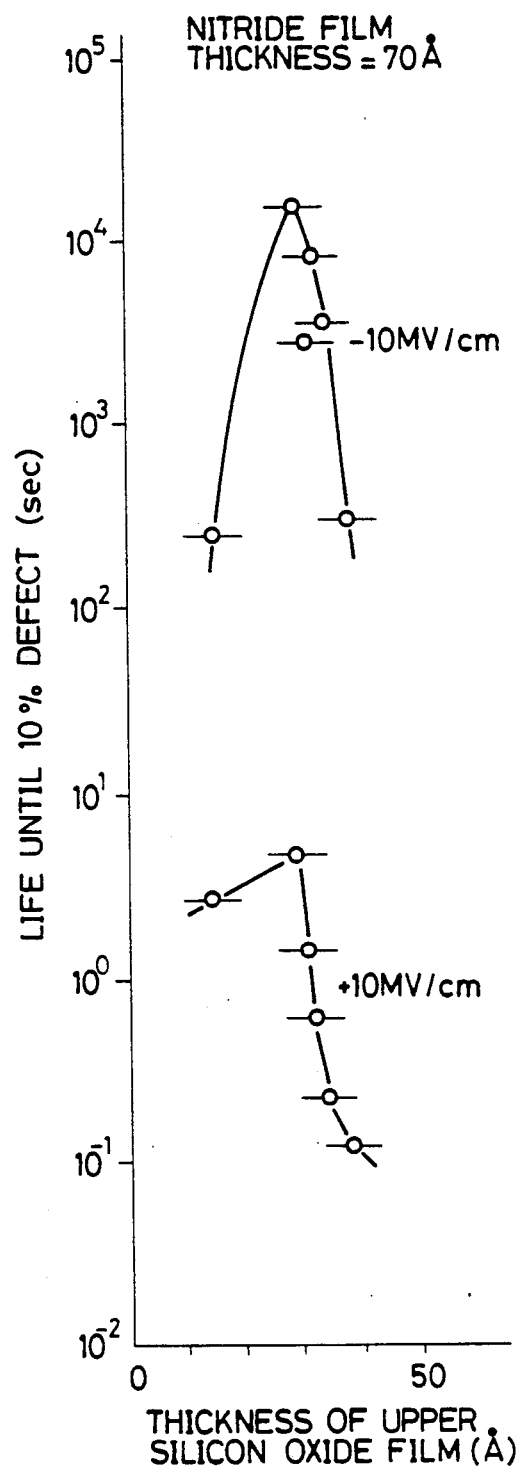

There was conducted another TDDB test in order to determine a correlation between the thickness of the upper oxide film 21 and that of the nitride film 20 in connection with the capacitor life. This test was conducted while varying the thickness of the upper oxide film 21, using a capacitor having a nitride film 20 70Å in thickness. The results of the test are as shown in FIGS. 9B and 9C. In FIG. 9B, the capacitor life is indicated in terms of the time taken until breakdown of the insulting layers in 50% test products out of one hundred test products under the application of an electric field of ±10 MV/cm in terms of silicon film to each insulating layer of a three-layer structure. FIG. 9C also shows the capacitor life in terms of the time taken until breakdown of 10% test products. In FIGS. 9B and 9C there are also shown results obtained by positive-negative reversal of the voltage applied between the first and second electrode layer 18, 22 of the capacitor.

From the test results shown in FIGS. 9A to 9C it turned out that in the thickness range of the nitride film 20 from 70Å to 200Å, the capacitor life was the longest in the thickness range of the oxide film 21 from 25Å to 35Å.

The reason why a long life is obtained in the thickness range of the upper oxide film 21 from 25Å to 35Å is presumed to be as follows. If the thickness of the upper oxide film 21 is smaller than 25Å, it is impossible for the upper oxide film 21 to reduce the density of defects remaining in the nitride film 20, resulting, in that the time taken until breakdown of the insulating layer in the TDDB test becomes shorter. And if the thickness of the upper oxide film 21 exceeds 35Å, the characteristic of the upper oxide film 21 becomes predominant rather than that of the nitride film 20 in connection with the dielectric breakdown characteristic, so the amount of electric charge accumulated in the upper oxide film 21 becomes larger, thus leading to a shorter timer taken until breakdown of the insulating layer.

Figure 1B:
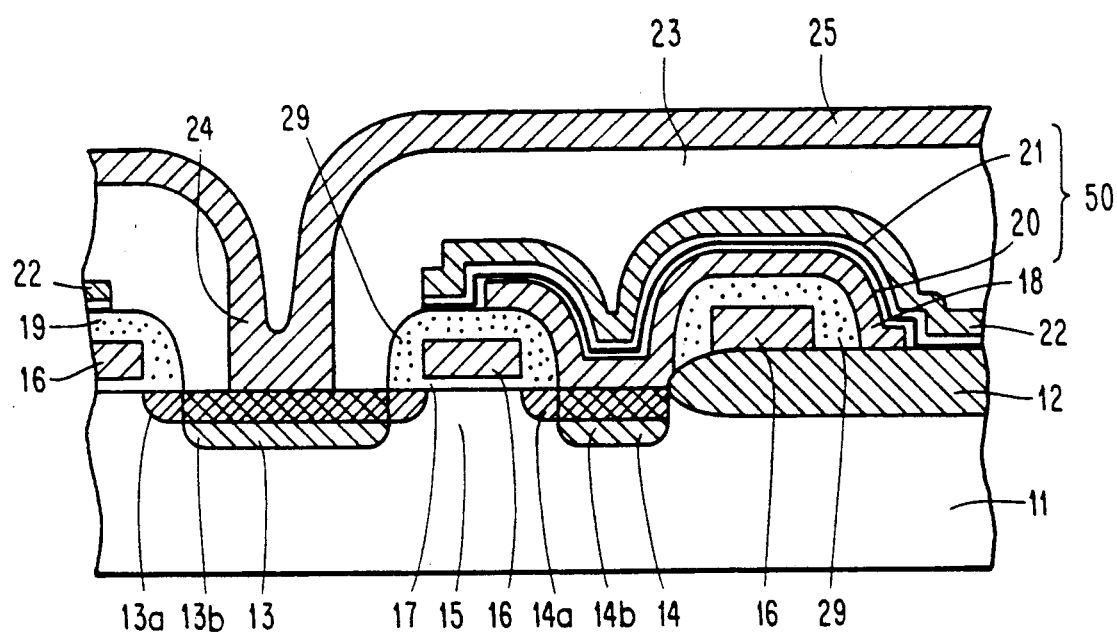

Although in the above embodiment there was adopted a three layer structure of the insulating layer comprising the lower oxide film 19, nitride film 20 and upper oxide film 21, there may be adopted a two-layer structure comprising the nitride film 20 and the upper oxide film 21. Such structure is shown in FIG. 1B. This figure is the similar to FIG. 1A with the same elements identified by the same reference numerals. The lower oxide film 19 of FIG. 1A has been removed. In the two-layer structure, the lower oxide film 19 formed by natural oxidation may be removed by (a) heat treatment in a hydrogen gas ($H_2$) atmosphere at 1,100° C. or (b) heat treatment in a [$H_2 + Si_2H_6$] atmosphere at 850° C. as shown, for example, in "Reducing Temperature of Surface Purifying Treatment in L-SBE Process of 28a-N10CVDa-Si" (A paper of the Japanese Society of Applied Physics, Autumn 1986, P. 492).

In the capacitor of the DRAM mentioned above there has heretofore been used an upper oxide film having a thickness of 40Å. According to the present invention, however, it is possible to reduce the upper oxide film thickness to about 30Å. Consequently, the thickness of the capacitor insulating layer is reduced with the result that the capacitance which is inverse proportion the insulating film thickness increases. The increase in capacitance of the DRAM reduces the rate of occurrence of soft error. The "soft error" means the following phenomenon. Electrons created by the incidence of α-ray upon the memory cell portion of the DRAM are captured by the capacity portion of the capacitor and act as erroneous information, causing reversal of information. The occurrence of the error causes malfunction of the DRAM, thus leading to deteriorated reliability. Therefore, reducing the soft error by increasing the capacitance of the DRAM is effective in improving the memory reliability.

According to the present invention, as set forth hereinabove, in a semiconductor device having a capacitor comprising first and second electrode layers and an insulating layer interposed between both electrode layers, the insulating layer of the capacitor includes a silicon nitride film formed on the first electrode layer and a silicon oxide film formed on the upper surface of the silicon nitride film, and the thickness of the silicon oxide film is set at a value not smaller than 25Å and not larger than 35Å, so the density of defects in the silicon nitride film of the insulating layer is reduced and the amount of an electric charge accumulated in the silicon oxide film can be suppressed, thus affording a semiconductor device of long life and high reliability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A capacitor comprising:
   a first electrode layer formed on one major surface of a semiconductor substrate or over said one major surface;
   a silicon nitride film formed in contact with the surface of said first electrode layer;
   a silicon oxide film formed in contact with the surface of said silicon nitride film and having a thickness not smaller than 25Å and not larger than 35Å; and
   a second electrode layer formed on the surface of said silicon oxide film.

2. A capacitor according to claim 1, wherein said first and second electrode layers are formed by a polycrystalline silicon.

3. A semiconductor memory including a memory cell having one access transistor and one capacitor and also comprising;
   a semiconductor substrate having on a major surface thereof an insulating film for the isolation of said memory cell,
   said access transistor having a pair of source/drain regions formed on the major surface of said semiconductor substrate and a gate electrode formed through a gate insulating on the major surface of said semiconductor substrate positioned between said source/drain regions, said gate electrode being connected to a word line,
   said capacitor having a first electrode layer one end of which is positioned on said gate electrode through an insulating film and the other end positioned on said insulating film for the isolation of said memory cell and part of which is connected to one of said source/drain regions, also having a dielectric layer formed on said first electrode layer and further having a second electrode layer formed on said dielectric layer,
   said dielectric layer/including a silicon nitride film formed in contact with the surface of said first electrode layer and a silicon oxide film formed on the surface of said silicon nitride film and having a thickness not smaller than 25Å and not larger than 35Å.

4. A semiconductor memory according to claim 3, wherein said first and second electrode layers are formed by a polycrystalline silicon.

* * * * *